(12) United States Patent
Kwon et al.

(10) Patent No.: US 12,471,503 B2
(45) Date of Patent: Nov. 11, 2025

(54) SUPERCONDUCTING QUANTUM COMPUTING APPARATUS INCLUDING FREQUENCY TUNABLE DEVICES

(71) Applicant: Samsung Electronics Co., Ltd., Suwon-si (KR)

(72) Inventors: Hyeok Shin Kwon, Suwon-si (KR); Dae Yun Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 18/739,940

(22) Filed: Jun. 11, 2024

(65) Prior Publication Data

US 2025/0228142 A1    Jul. 10, 2025

(30) Foreign Application Priority Data

Jan. 10, 2024   (KR) .................. 10-2024-0004168

(51) Int. Cl.
*H03K 17/92* (2006.01)
*H10N 60/12* (2023.01)
*H10N 60/80* (2023.01)
*H10N 60/82* (2023.01)
*H10N 60/85* (2023.01)

(52) U.S. Cl.
CPC ............ *H10N 60/12* (2023.02); *H03K 17/92* (2013.01); *H10N 60/805* (2023.02); *H10N 60/82* (2023.02); *H10N 60/85* (2023.02)

(58) Field of Classification Search
CPC ...... H10N 60/12; H10N 60/805; H10N 60/82; H10N 60/85; H03K 17/92

USPC ................................................... 327/527, 528
See application file for complete search history.

(56) References Cited

U.S. PATENT DOCUMENTS

| 7,876,145 | B2 | 1/2011 | Koch | |
|---|---|---|---|---|
| 9,882,112 | B2 * | 1/2018 | Kwon | .................. H10N 69/00 |
| 10,969,443 | B2 | 4/2021 | Martinis | |
| 11,430,831 | B2 | 8/2022 | Gumann et al. | |
| 2023/0027682 | A1 | 1/2023 | Molavi et al. | |
| 2024/0423101 | A1 * | 12/2024 | Kim | ........................ H01P 7/082 |

(Continued)

FOREIGN PATENT DOCUMENTS

| CN | 109886414 B | 6/2019 |
|---|---|---|
| CN | 112331693 B | 8/2023 |
| CN | 116579434 A | 8/2023 |

(Continued)

OTHER PUBLICATIONS

U.S. Appl. No. 18/602,554, filed Mar. 12, 2024, Dae Yun Kim et al., Samsung Electronics Co, Ltd.

(Continued)

*Primary Examiner* — Tomi Skibinski
(74) *Attorney, Agent, or Firm* — NSIP Law

(57) ABSTRACT

A superconducting computing apparatus includes: frequency tunable devices connected to each other and arranged in a shape; a ferromagnetic film disposed adjacent to the frequency tunable devices and having an up magnetic domain or a down magnetic domain; and a control circuit configured to adjust a position of a magnetic domain wall in the ferromagnetic film by applying a current to the ferromagnetic film, wherein the position of the magnetic domain wall controls a resonant frequency of the frequency tunable devices.

20 Claims, 12 Drawing Sheets

(56) References Cited

U.S. PATENT DOCUMENTS

2025/0081858 A1* 3/2025 Kim .................... H10N 60/805

FOREIGN PATENT DOCUMENTS

| KR | 10-2390376 B1 | 4/2022 |
|----|---------------|--------|
| WO | WO 2023/104685 A1 | 6/2023 |

OTHER PUBLICATIONS

U.S. Appl. No. 18/609,675, filed Mar. 19, 2024, Dae Yun Kim et al., Samsung Electronics Co, Ltd.

* cited by examiner

SUPERCONDUCTING QUANTUM COMPUTING APPARATUS INCLUDING FREQUENCY TUNABLE DEVICES

CROSS-REFERENCE TO RELATED APPLICATIONS

This application claims priority from Korean Patent Application No. 10-2024-0004168, filed on Jan. 10, 2024, in the Korean Intellectual Property Office, the entire disclosure of which is incorporated herein by reference for all purposes.

BACKGROUND

1. Field

The following description relates to a superconducting computing apparatus including tunable devices, and a method of controlling a resonant frequency.

2. Description of Related Art

A quantum computer operates based on principles of quantum mechanics, such as quantum superposition and quantum entanglement. A unit element capable of storing information by using principles of quantum mechanics (or the information itself) is called a quantum bit or a qubit, which can be used as a basic unit of information in quantum computing.

With growing interest in quantum computing, research has been conducted on various types of qubits. Qubits may be implemented as various types of devices, such as photonic qubits, ion trap qubits, topological qubits, superconducting qubits, etc., among which the most popular qubits so far are superconducting qubits using superconducting materials.

SUMMARY

In one general aspect, a superconducting computing apparatus includes: frequency tunable devices connected to each other and arranged in a shape; a ferromagnetic film disposed adjacent to the frequency tunable devices and having an up magnetic domain or a down magnetic domain; and a control circuit configured to adjust a position of a magnetic domain wall in the ferromagnetic film by applying a current to the ferromagnetic film, wherein the position of the magnetic domain wall controls a resonant frequency of the frequency tunable devices.

The frequency tunable devices may include a tunable qubit and a tunable qubit coupler, each of which are comprised of a superconducting material.

A write head may be configured to generate the up magnetic domain or the down magnetic domain on the ferromagnetic film.

The ferromagnetic film may be disposed to have a shape corresponding to the shape of the arrangement of the frequency tunable devices, and may be placed at a predetermined distance from the frequency tunable devices.

The ferromagnetic film may be disposed on a different layer from a layer of the frequency tunable devices.

The ferromagnetic film may be disposed on a layer under the frequency tunable devices and at a bottom end of a Josephson junction of the respective frequency tunable devices.

The ferromagnetic film may be placed such that a magnetic field thereof is within effective reach of a first of the frequency tunable devices, and wherein the ferromagnetic film is placed such that the magnetic field thereof is not within effective reach of a second of the frequency tunable devices.

The ferromagnetic film may be disposed on a different layer from a layer of the second frequency tunable device.

The ferromagnetic film may include Pt/Co/MgO, Pt/Co/AlOx, Pt/CoFeB/MgO, Pt/(Co/Ni)n, or Pt/(Co/Pt)n.

The control circuit may be configured to move the position of the magnetic domain wall along the ferromagnetic film by applying a current to the ferromagnetic film to induce a spin-transfer torque (STT) phenomenon.

The control circuit may be configured to apply a pulse-type current greater than or equal to a predetermined threshold value.

The control circuit may be configured to control on/off of the frequency tunable devices by adjusting a direction of the current.

The control circuit may be configured to control the resonant frequency of the frequency tunable devices by using a model that defines a relationship between the position of the magnetic domain wall and a magnetic flux passing through each frequency-tunable device, and a model that defines a relationship between the magnetic flux and the resonant frequency.

The superconducting material may include aluminum (Al), Niobium (Nb), Indium (In), Alpha-Tantalum ($\alpha$-Ta), Titanium (Ti), lead (Pb), Vanadium (V), or a compound thereof.

A method of controlling a resonant frequency of frequency tunable devices which are connected to each other, wherein the controlling is performed using a ferromagnetic film arranged for magnetic interaction with the frequency tunable devices, the ferromagnetic film disposed adjacent to the frequency tunable devices and having an up magnetic domain or a down magnetic domain, and the method comprising: adjusting a position of a magnetic domain wall in the ferromagnetic film by applying a current to the magnetic film; and the adjusting of the position of the magnetic domain wall controlling a resonant frequency of the frequency tunable devices.

The frequency tunable device may include a tunable qubit and a tunable qubit coupler which are each made of a superconducting material.

The method may further include generating the up magnetic domain or the down magnetic domain on the ferromagnetic film.

The applying of the current may include applying a pulse-type current greater than or equal to a predetermined threshold value.

The current may adjust the position of the magnetic domain wall by inducing a spin-transfer torque (STT) phenomenon.

The ferromagnetic film may disposed corresponding to an arrangement of the frequency tunable devices, and may be placed at a predetermined distance from the frequency tunable devices

Figure 1A:
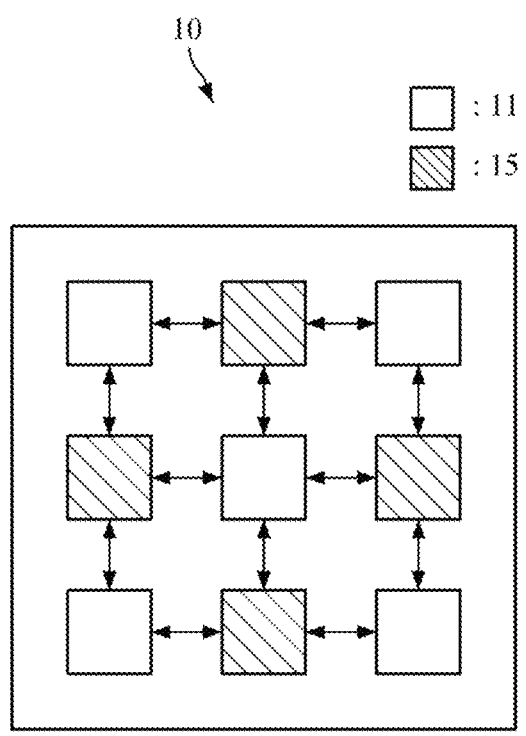
FIG. 1A illustrates a structure of a superconducting qubit-based quantum computing apparatus according to one or more embodiments.

Throughout the drawings and the detailed description, unless otherwise described or provided, the same or like drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

The steps of all methods described herein can be performed in any suitable order unless otherwise indicated herein or otherwise clearly contradicted by context. The use of any and all examples, or language (e.g., such as, etc.) provided herein, is intended merely to better illuminate the disclosure and does not pose a limitation on the scope of the disclosure unless otherwise claimed.

Figure 1B:
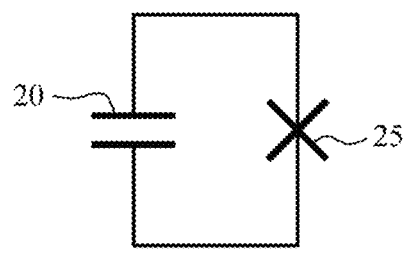
FIG. 1B is a circuit diagram of a frequency-fixed device, according to one or more embodiments.

FIG. 1A illustrates a structure of a superconducting qubit-based quantum computing apparatus (hereinafter referred to as a "superconducting computing apparatus"), according to one or more embodiments. FIG. 1B illustrates a frequency-fixed device, e.g., a fixed qubit or a fixed qubit coupler, and FIG. 1C is a circuit diagram schematically illustrating a frequency tunable device, e.g., a tunable qubit or a tunable qubit coupler.

Referring to FIG. 1A, a superconducting computing apparatus 10 includes a qubits 11 and qubit couplers 15 coupling the qubits. The qubit couplers 15 are required for quantum entanglement induced by qubit-qubit interactions, etc., and two or more qubits 11 are included in the superconducting computing apparatus 10, thus necessitating the qubit couplers 15 for qubit-qubit interactions.

The qubits 11 may be divided into two types: fixed qubit with a resonance frequency fixed at a specific value, and tunable qubit with a tunable resonance frequency. The qubit couplers 15 may also be divided into two types: fixed qubit coupler with a resonance frequency fixed at a specific value, and tunable qubit coupler with a tunable resonance frequency.

Figure 1C:
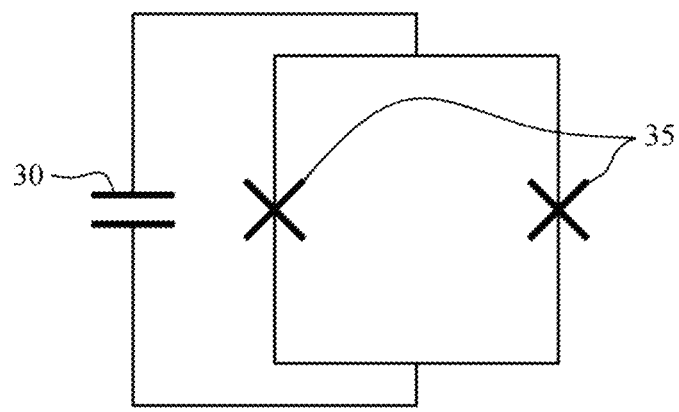
FIG. 1C illustrates a frequency tunable device, according to one or more embodiments.

The fixed qubit and the fixed qubit coupler may each be composed of, respectively, for example, a unit of at least one capacitor 20 and one Josephson junction 25 (FIG. 1B), and the tunable qubit and the tunable qubit coupler may each be composed of, for example, a unit of one capacitor 30 and two Josephson junctions 35 (FIG. 1C).

That is, the qubits and couplers may have the same structure, such that a qubit/coupler structure may be selected to function as either a qubit or a coupler depending on the purpose of use.

The tunable qubit may be tuned to a desired resonant frequency, and the tunable qubit coupler may be tuned to two different resonant frequencies for on/off control of quantum entanglement between qubits.

An example of setting a desired resonant frequency by applying a current to a ferromagnetic film is described below based on frequency-tunable devices.

Figure 1D:
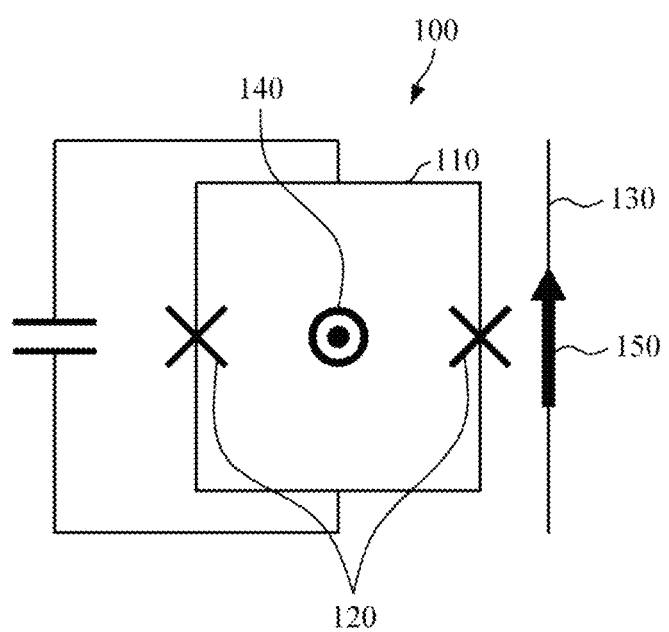
FIG. 1D is a diagram of controlling a resonance frequency of a commonly used frequency tunable device, according to one or more embodiments.

FIG. 1D is a diagram of controlling a resonant frequency of a commonly used frequency tunable device, according to one or more embodiments.

Referring to FIG. 1D, a tunable qubit 100 includes a superconducting quantum interface device (SQUID) 110 including two Josephson junctions 120, and includes a separate control line 130 adjacent to the qubit in order to apply a local magnetic field to the qubit.

Once a control current 150 is applied to the control line 130, a magnetic field is formed around the control line 130, and the formed magnetic field changes a magnetic flux 140 passing through the SQUID. In this case, the magnetic flux 140 passing through the SQUID causes a change in the critical current of the Josephson junction. The resonant frequency of the qubit is determined by the critical current of the Josephson junction; the resonant frequency of the qubit may be controlled by adjusting the control current 150 applied to the control line 130.

To improve the performance of the superconducting computing apparatus, a large number of qubits may be arranged in the apparatus, and in order to control, for example, several tens to hundreds of qubits, the apparatus requires a large number of flux lines (control lines, e.g., control line 130) corresponding to the large number of qubits.

However, if a large number of flux lines are contained in one superconducting quantum chip, the qubit performance in the chip is reduced due to magnetic flux noise of the flux lines, and there are also spatial constraints due to the number of qubits contained in one chip and the arrangement of qubits with other devices in the chip, etc., thereby making it difficult to produce multi-qubit chips.

Figure 2:
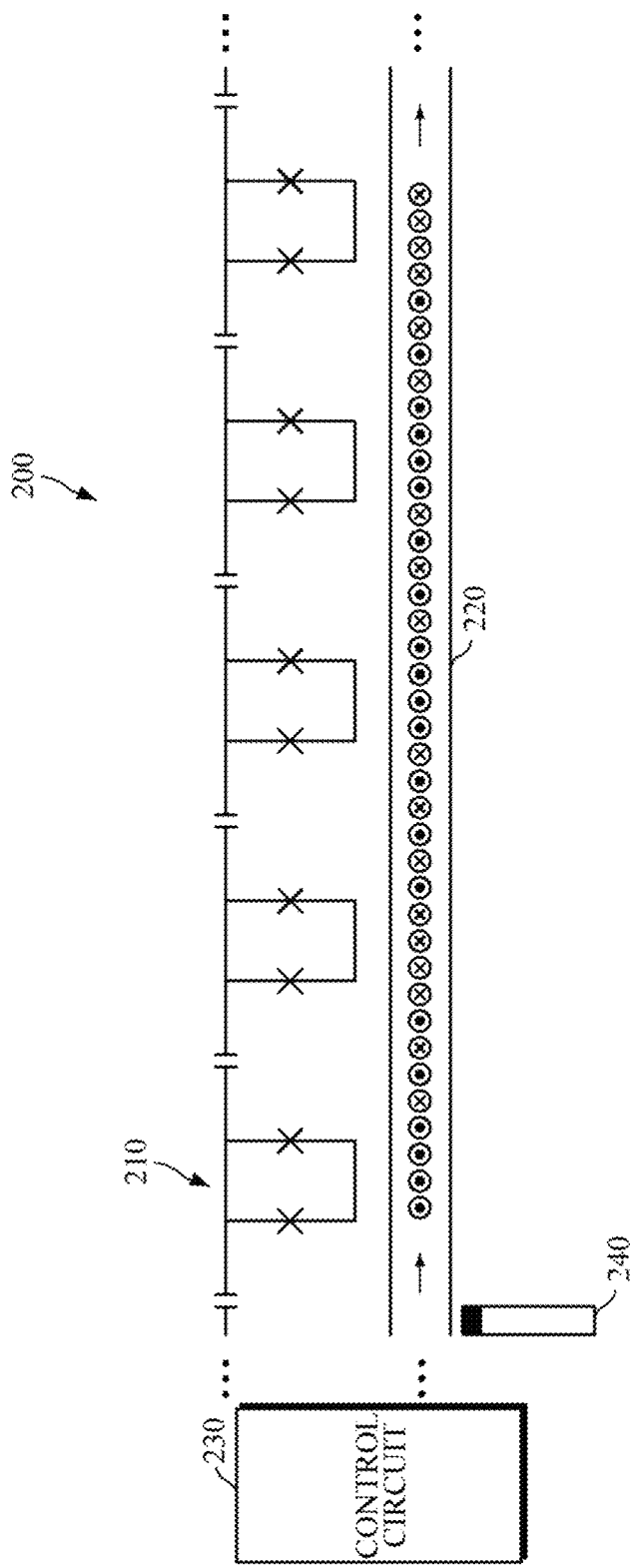
FIG. 2 illustrates a structure of a superconducting computing apparatus including frequency tunable devices, according to one or more embodiments.

FIG. 2 illustrates a structure of a superconducting computing apparatus including multiple frequency tunable devices, according to one or more embodiments.

A superconducting computing apparatus 200 may include frequency tunable devices 210, a ferromagnetic film 220, and a control circuit 230.

The frequency tunable devices 210 may be connected to each other in the superconducting computing apparatus 200 and arbitrarily or randomly arranged in a predetermined shape (e.g., straight line shape, loop shape, U-shape, etc.), and may be tunable qubits or tunable qubit couplers made of a superconducting material. In this case, the superconducting material may include at least one of aluminum (Al), Niobium (Nb), Indium (In), Alpha-Tantalum (α-Ta), Titanium (Ti), lead (Pb), Vanadium (V), and a compound thereof, but is not limited thereto. As used herein a "superconducting" material means a material capable of superconducting under appropriate conditions but does not require the material to necessarily be in a state of active superconductivity.

The ferromagnetic film 220 may be disposed adjacent to the frequency tunable devices 210, and may have an up magnetic domain or a down magnetic domain.

The term "ferromagnetic film" refers to a material in which the magnetic moment or magnetization of atoms is aligned in a specific direction even in the absence of an external magnetic field. The magnetizations of atoms/molecules in the ferromagnetic film have a preferred direction of alignment, which is called magnetic anisotropy.

For example, if the ferromagnetic film has perpendicular magnetic anisotropy, the magnetization of the ferromagnetic film prefers to be aligned in a vertical direction (e.g., +Z or −Z axis direction, or a normal) of the ferromagnetic film. If the ferromagnetic film has in-plane magnetic anisotropy, the magnetization of the ferromagnetic film prefers to be aligned in a plane direction (e.g., XY plane direction) of the ferromagnetic film. Generally, the ferromagnetic film may have a heterojunction structure with a heavy metal (e.g., Pt, Ta, W), a ferromagnet (e.g., Co, CoFeB, (CoNi)n, (CoPt)n), and an insulator (e.g., MgO, AlOx, TaOx), and may include, for example, at least one of Pt/Co/MgO, Pt/Co/AlOx, Pt/CoFeB/MgO, Pt/(Co/Ni)n, and Pt/(Co/Pt)n.

The ferromagnetic film 220 may have an up magnetic domain or a down magnetic domain, and may have a magnetic domain wall disposed between the magnetic domains.

Figure 3:
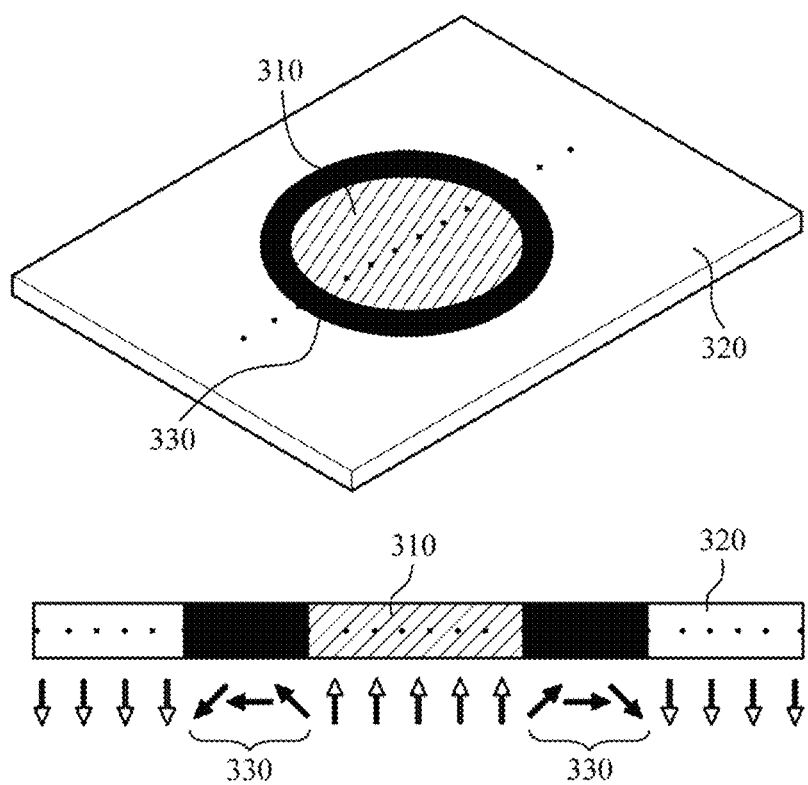
FIG. 3 shows a ferromagnetic film having a magnetic domain wall, according to one or more embodiments.

FIG. 3 shows a ferromagnetic film having a magnetic domain wall, according to one or more embodiments.

The magnetization in the ferromagnetic film prefers to be aligned in an upward or downward direction due to perpendicular magnetic anisotropy, and has the property that magnetizations aligned in an upward direction are gathered as upward magnetizations, and magnetizations aligned in a downward direction are gathered as downward magnetizations, and a region where the magnetizations are aligned in the same direction (e.g., upward or downward) is called a magnetic domain.

Referring to FIG. 3, by applying a predetermined external magnetic field to a ferromagnetic film, an up magnetic domain 310 (in which magnetizations are aligned in an upward direction) and a down magnetic domain 320 (in which magnetizations are aligned in a downward direction) are created, such that a magnetic domain wall 330 may be created. The magnetic domain wall 330 corresponds to a portion of the ferromagnetic film between the up magnetic domain 310 and the neighboring down magnetic domain 320. In this case, a width of the magnetic domain wall 330 may be, for example, in a range of several angstroms to several tens of nanometers, but is not limited thereto. In addition, considering the characteristics of the ferromagnetic film, the created magnetic domain wall 330 remains the same (at the same place in the ferromagnetic film) even when the external magnetic field disappears, and depending on the type of ferromagnetic film, the magnetic domain wall 330 may be moved only by applying a magnetic field greater than or equal to a predetermined critical value.

Referring back to FIG. 2, the control circuit 230 may apply a current to the ferromagnetic film 220, and may control the resonant frequency of the frequency tunable devices 210 based on the applied current (current applied to the ferromagnetic film 210). For example, the control circuit 230 may control the current applied to the ferromagnetic film 220 to adjust the position of a magnetic domain wall in the ferromagnetic film 220, and thus the control circuit 230 may control the resonant frequency of the frequency tunable devices 210 all at once.

In this case, by directly applying a current to the ferromagnetic film 220 to induce a spin-transfer torque (STT) phenomenon, the control circuit 230 may move the position of the magnetic domain wall in the ferromagnetic film 220.

The spin-transfer torque (STT) is a phenomenon in which when a spin direction of conduction electrons injected into a magnetic material (e.g., ferromagnetic material) is not parallel to a magnetization direction of the magnetic material, the spin angular momentum of the conduction electrons is transferred to the magnetic moment of the magnetic material, thereby changing the magnetization direction of the magnetic material. The spin-transfer torque (STT) generated by the applied current allows the magnetic domain wall, formed in the ferromagnetic film, to move in a direction of the current or in an opposite direction of the current.

The control circuit 230 may apply a pulse-type current, greater than or equal to a predetermined threshold value, to the ferromagnetic film 220. The magnetization of the ferromagnetic film 220 remains the same even when the external magnetic field disappears, such that the control circuit 230 may apply the current only once without needing to continuously apply the current greater than or equal to the predetermined threshold value, and may apply, for example, the pulse-type current.

For example, by applying the current to the ferromagnetic film 220 and adjusting a direction of the applied current, the control circuit 230 may control, at once, whether all of the frequency tunable devices are on or off, as described next.

Figure 4A:
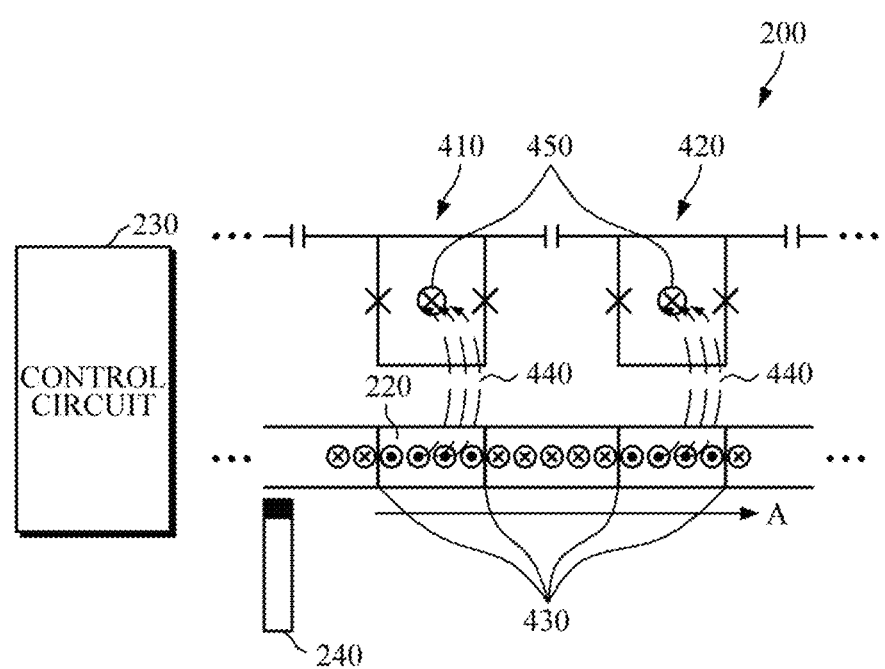
FIGS. 4A and 4B show on/off control of frequency tunable devices, according to one or more embodiments.
Figure 4B:
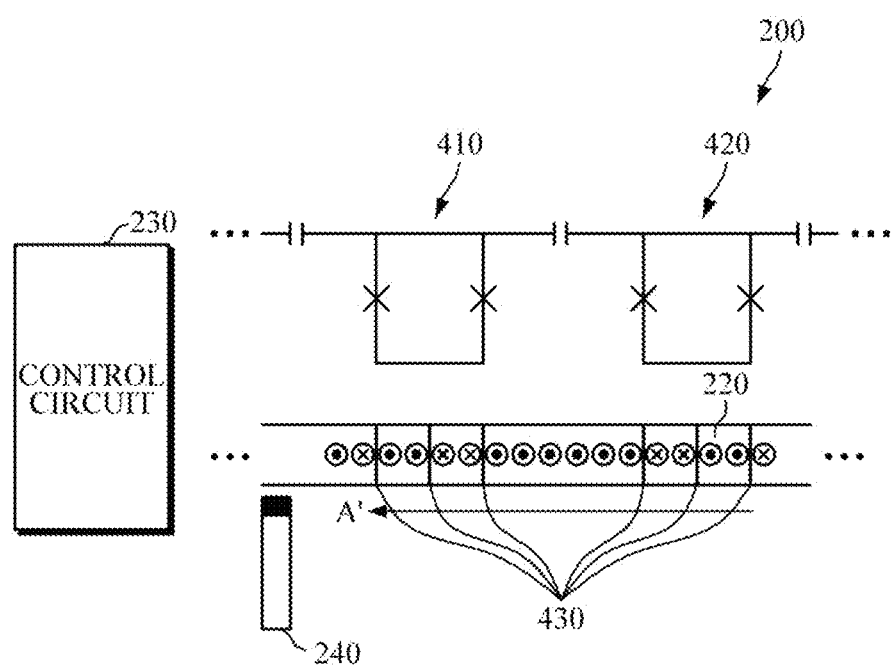

FIGS. 4A and 4B show on/off control of frequency tunable devices, according to one or more embodiments.

Referring to FIG. 4A, in the case where a vertically upward magnetic domain (e.g., ⊙⊙⊙⊙) is formed between a first qubit 410 and a second qubit 420 as the control circuit 230 applies a current in direction A to move a magnetic domain wall 430 of the ferromagnetic film 220 in direction A, a magnetic field 440 that runs from top to bottom is formed in the first qubit 410 and the second qubit 420 adjacent to ferromagnetic film 220, such that a magnetic flux 450 that travels from top to bottom may be formed in the first qubit 410 and the second qubit 420, and the first qubit 410 and the second qubit 420 may be controlled, for example, in an on state. In other words, the current controlled by the control circuit 230 in on way aligns the magnetic domains (up or down) with the qubits, and when the current is controlled in another way the magnetic domains do not align with the qubits which are effectively turned off.

Referring to FIG. 4B, in the case where magnetic domains/walls 430 (e.g., ⊙⊗⊙⊗), which are not strong enough to generate an effective magnetic field, are formed between the first qubit 410 and the second qubit 420 as the control circuit 230 applies a current in direction A' to move the magnetic domain wall 430 of the ferromagnetic film 220 in direction A', the first qubit 410 and the second qubit 420 may be controlled, for example, in an off state.

While FIGS. 4A and 4B illustrate an example of controlling two frequency tunable devices, the same method may be used for controlling on/off of more than two frequency tunable devices.

The control circuit 230 may control the resonance frequency of the frequency tunable devices by using a model that defines a relationship between the position of the magnetic domain wall (along the ferromagnetic film) and a magnetic flux passing through each frequency tunable device, and a model that defines a relationship between the magnetic flux and the resonant frequency of the frequency tunable devices.

For example, the control circuit 230 may obtain a magnetic flux according to a position of the magnetic domain wall of each frequency tunable device by using a model that is stored in a storage and that defines a relationship between the position of the magnetic domain wall and the magnetic flux, and may finally obtain and control the resonant frequency of each of the frequency tunable devices by using a model that defines a relationship between the magnetic flux and the resonant frequency.

Referring back to FIG. 2, the superconducting computing apparatus 200 may further include a write head 240 spaced apart from the ferromagnetic film 220 and configured to generate the up magnetic domain or the down magnetic domain on the ferromagnetic film 220 near the write head 420.

The write head 240 may generate the up magnetic domain or the down magnetic domain in a specific region of the ferromagnetic film 220 at a predetermined position in the superconducting computing apparatus 200. For example, if a separate control circuit applies a pulse-type current to the write head 240, the write head 240 may generate the up magnetic domain or the down magnetic domain at a predetermined portion of the ferromagnetic film 220, and the control circuit 230 may move the magnetic domain wall, formed between the generated magnetic domains, by applying the pulse-type current. That is, it is possible to control the frequency tunable devices by controlling a pulsed current sequence of the write head 240 and the control circuit 230 (the former setting magnetic domains and the latter moving them).

In addition, the write head 240 reconfigures a desired magnetic domain arrangement by entirely resetting a direction of the magnetic domain of the ferromagnetic film 220, and the control circuit 230 moves a magnetic domain wall according to the reset direction of the magnetic domain by applying a current to the ferromagnetic film 220, to control the plurality of frequency tunable devices. The method of controlling the frequency tunable devices by using the write head 240 and the control circuit 230 is not limited thereto.

The ferromagnetic film 220 may be placed adjacent to the frequency tunable devices.

Referring back to FIG. 2, the ferromagnetic film 220 may be disposed corresponding to the arrangement of the frequency tunable devices 210, and the film may be spaced apart from the frequency tunable devices 210 by a distance (e.g., several micrometers (μm) to several tens of micrometers (μm)), at which the magnetic flux of the frequency tunable devices 210 may change.

Figure 5A:
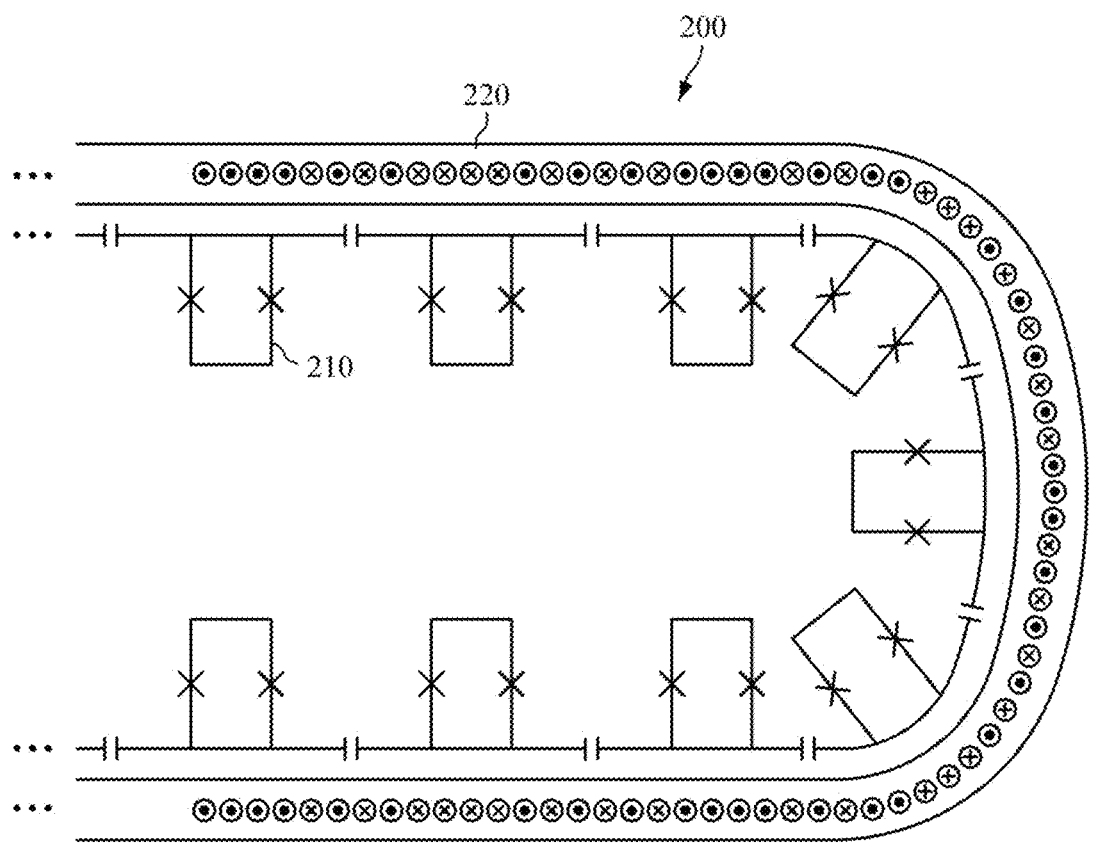
FIGS. 5A to 5C illustrate an arrangement of frequency tunable devices and a ferromagnetic film, according to one or more embodiments.
Figure 5B:
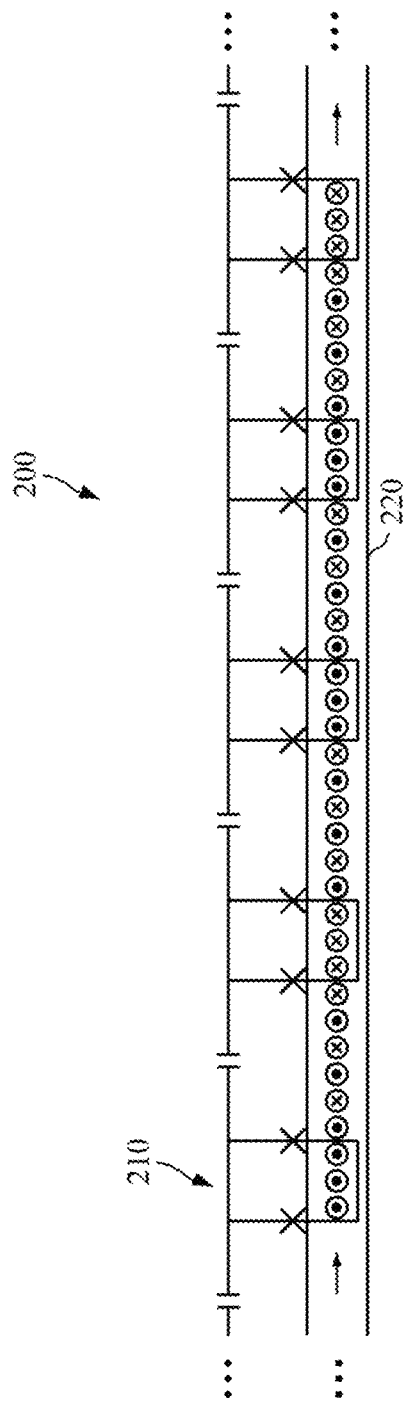
Figure 5C:
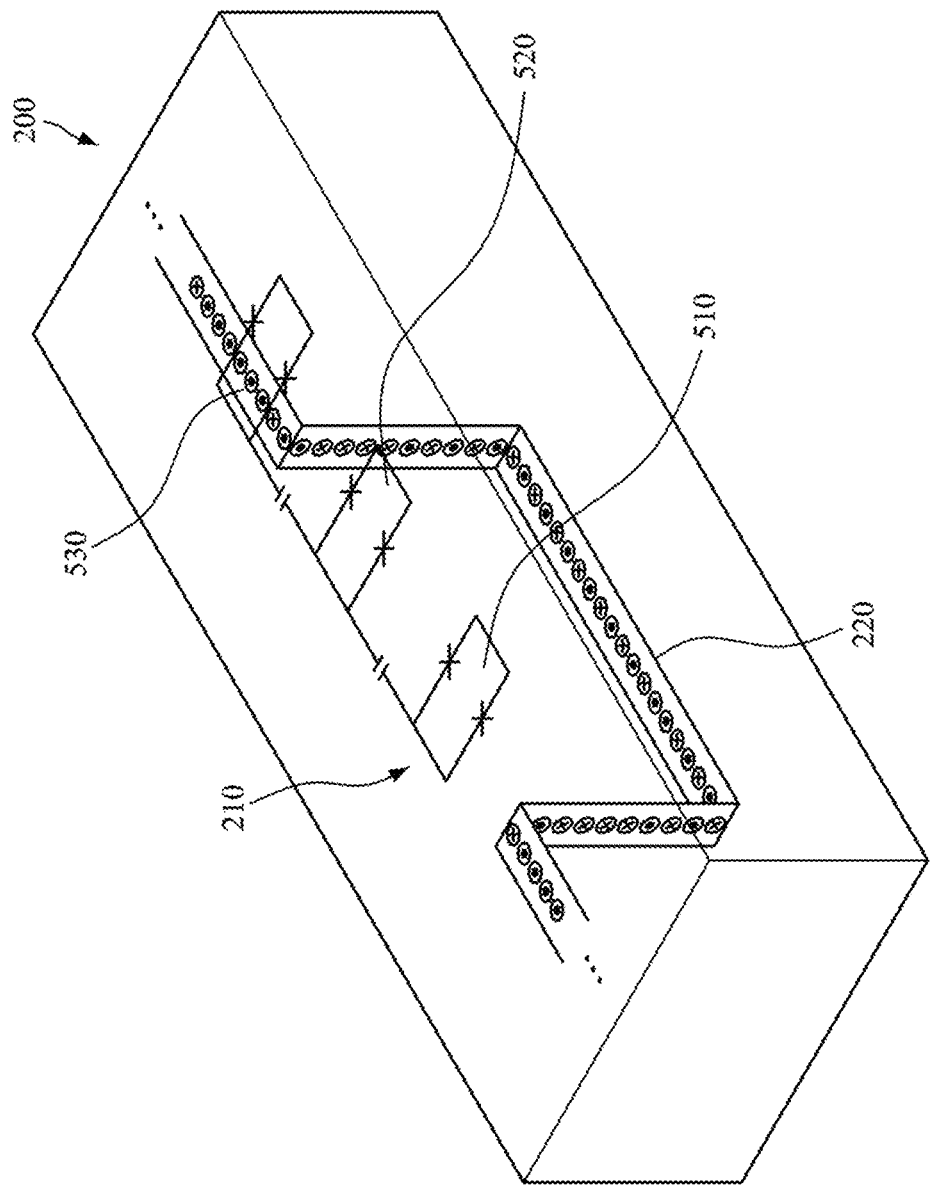

FIGS. 5A to 5C illustrate an arrangement of frequency tunable devices and a ferromagnetic film according to one or more embodiments.

Referring to FIG. 5A, in the case where the frequency tunable devices 210 are arranged in a U-shape, the ferromagnetic film 220 may also be formed in the U-shape at a predetermined distance from each of the frequency tunable devices 210 so as to correspond to the arrangement of the frequency tunable devices 210. In this case, the U-shape is merely an example, and the frequency tunable devices 210 may be arranged in various shapes, such as a circular shape, an oval shape, a straight line shape, a rectangular shape, a square shape, etc., and the ferromagnetic film 220 may also be formed in shapes corresponding to various shapes of the frequency tunable devices 210, at a distance from the plurality of frequency tunable devices 210.

The ferromagnetic film 220 may be disposed on a layer other than a layer for the frequency tunable devices 210. For example, the ferromagnetic film 220 may be disposed on a layer under the frequency tunable devices 210 and at a bottom end of a Josephson junction of the respective frequency tunable devices 210.

Referring to FIG. 5B, the ferromagnetic film 220 may be disposed at a lower end of the (below) frequency tunable devices 210 in a linear arrangement. In this case, the ferromagnetic film 220 may be disposed at the bottom end of the Josephson junction, e.g., so as to pass through the Josephson junction, thereby obtaining a strong magnetic flux, and allowing the magnetic flux to be controlled in a wider range.

The ferromagnetic film 220 may be placed within functional reach of the magnetic field with respect to certain predetermined devices among the frequency tunable devices 210, and the film may be placed out of the functional reach of the magnetic field with respect to frequency tunable devices other than the predetermined devices. For example, the ferromagnetic film 220 may be disposed on a different layer from devices other than the predetermined devices, so as not to be affected by the magnetic field.

Referring to FIG. 5C, the ferromagnetic film 200 may be placed within reach of the magnetic field with respect to a predetermined device 530 which is to be controlled among the frequency tunable devices 210, and may be placed out of reach of the magnetic field with respect to frequency tunable devices 510 and 520 which are not desired to be controlled and are therefore disposed on a different layer that that of frequency tunable devices 210, with a changed shape. The arrangement of the ferromagnetic film 220 and the frequency tunable devices 210 is not limited thereto.

Generally, in the superconducting computing apparatus composed of several tens to hundreds of qubits, several tens to hundreds of flux lines are disposed in a chip which is a few centimeters (cm) to tens of centimeters in size. In this case, the qubit performance is reduced due to magnetic flux noise caused by the flux lines, and many problems occur in terms of process and control in order to secure a necessary space for arrangement of qubits and flux lines.

In the above example of controlling the resonant frequency of the qubits all at once by adjusting the position of the magnetic domain wall in the ferromagnetic film placed adjacent to the qubits, the magnetic flux noise and spatial constraints may be overcome by minimizing placement of flux lines in the chip, and the resonance frequency of the qubits may be stably controlled by a non-volatile control method in which the resonance frequency is controlled by applying, once, to the ferromagnetic film, a current, greater than or equal to a threshold value.

Figure 6:
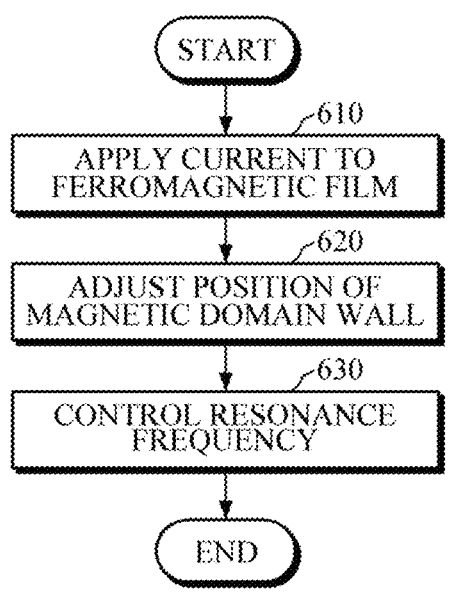
FIG. 6 illustrates a method of controlling the resonance frequency of frequency tunable devices, according to one or more embodiments.

FIG. 6 illustrates a method of controlling the resonant frequency of frequency tunable devices according to one or more embodiments.

The method of FIG. 6 is an example of a method of controlling the resonance frequency of the frequency tunable devices according to the embodiments of FIGS. 2 to 5C which are described in detail above, and thus will be briefly described below in order to avoid redundancy.

The superconducting computing apparatus may include frequency tunable devices connected to each other and arranged in a predetermined shape, and a ferromagnetic film disposed adjacent to the frequency tunable devices and having an up magnetic domain or a down magnetic domain.

The frequency tunable device may be a tunable qubit or a tunable qubit coupler (each made of a superconducting material), and the ferromagnetic film may be disposed with a shape/arrangement correspond to the shape/arrangement of the frequency tunable devices. The ferromagnetic film may be placed at a predetermined distance, e.g., a distance such that the frequency tunable devices are within reach of the magnetic field of the ferromagnetic film.

First, the superconducting computing apparatus may apply a current to the ferromagnetic film in 610. For example, the superconducting computing apparatus may apply a current, greater than or equal to a predetermined threshold value, to the ferromagnetic film. Here, the sufficiency (strength) of the applied current may be such that the corresponding magnetization of the ferromagnetic film 220 remains the same even when the external magnetic field disappears, such that the superconducting computing apparatus may apply a current, for example, a pulse-type current, only once, i.e., without need to continuously apply the current greater than or equal to the predetermined threshold value.

Then, the superconducting computing apparatus may adjust (move) the position of a magnetic domain wall in the ferromagnetic film in 620. The superconducting computing apparatus may adjust the position of the magnetic domain wall by applying a current to the ferromagnetic film to induce a spin-transfer torque (STT) phenomenon.

Subsequently, the superconducting computing apparatus may control the resonant frequency of the frequency tunable devices in 630. The superconducting computing apparatus may control the resonance frequency of each frequency tunable device by using (i) a model that defines a relationship between the position of the magnetic domain wall and a magnetic flux passing through each frequency tunable device, and by using (ii) a model that defines a relationship between the magnetic flux and the resonance frequency.

Before applying a current to the ferromagnetic film, the superconducting computing apparatus may generate an up magnetic domain or a down magnetic domain on the ferromagnetic film, and may also redesign a desired magnetic domain arrangement by entirely resetting a direction of the generated magnetic domain.

The present disclosure has been described herein with regard to preferred embodiments. However, it will be obvious to those skilled in the art that various changes and modifications can be made without changing technical conception and essential features of the present disclosure. Thus, it is clear that the above-described embodiments are illustrative in all aspects and are not intended to limit the present disclosure.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A superconducting computing apparatus comprising:
   frequency tunable devices connected to each other and arranged in a shape;
   a ferromagnetic film disposed adjacent to the frequency tunable devices and having an up magnetic domain or a down magnetic domain; and
   a control circuit configured to adjust a position of a magnetic domain wall in the ferromagnetic film by applying a current to the ferromagnetic film, wherein the position of the magnetic domain wall controls a resonant frequency of the frequency tunable devices.

2. The superconducting computing apparatus of claim 1, wherein the frequency tunable devices comprise a tunable qubit and a tunable qubit coupler, each of which are comprised of a superconducting material.

3. The superconducting computing apparatus of claim 2, wherein the superconducting material comprises aluminum (Al), Niobium (Nb), Indium (In), Alpha-Tantalum (α-Ta), Titanium (Ti), lead (Pb), Vanadium (V), or a compound thereof.

4. The superconducting computing apparatus of claim 1, further comprising a write head configured to generate the up magnetic domain or the down magnetic domain on the ferromagnetic film.

5. The superconducting computing apparatus of claim 1, wherein the ferromagnetic film is disposed to have a shape corresponding to the shape of the arrangement of the frequency tunable devices, and is placed at a predetermined distance from the frequency tunable devices.

6. The superconducting computing apparatus of claim 5, wherein the ferromagnetic film is disposed on a different layer from a layer of the frequency tunable devices.

7. The superconducting computing apparatus of claim 6, wherein the ferromagnetic film is disposed on a layer under the frequency tunable devices and at a bottom end of a Josephson junction of the respective frequency tunable devices.

8. The superconducting computing apparatus of claim 1, wherein the ferromagnetic film is placed such that a magnetic field thereof is within effective reach of a first of the frequency tunable devices, and wherein the ferromagnetic film is placed such that the magnetic field thereof is not within effective reach of a second of the frequency tunable devices.

9. The superconducting computing apparatus of claim 8, wherein the ferromagnetic film is disposed on a different layer from a layer of the second frequency tunable device.

10. The superconducting computing apparatus of claim 1, wherein the ferromagnetic film comprises Pt/Co/MgO, Pt/Co/AlOx, Pt/CoFeB/MgO, Pt/(Co/Ni)n, or Pt/(Co/Pt)n.

11. The superconducting computing apparatus of claim 1, wherein the control circuit is configured to move the position of the magnetic domain wall along the ferromagnetic film by applying a current to the ferromagnetic film to induce a spin-transfer torque (STT) phenomenon.

12. The superconducting computing apparatus of claim 11, wherein the control circuit is configured to apply a pulse-type current greater than or equal to a predetermined threshold value.

13. The superconducting computing apparatus of claim 12, wherein the control circuit is configured to control on/off of the frequency tunable devices by adjusting a direction of the current.

14. The superconducting computing apparatus of claim 13, wherein the control circuit is configured to control the resonant frequency of the frequency tunable devices by using a model that defines a relationship between the position of the magnetic domain wall and a magnetic flux passing through each frequency-tunable device, and a model that defines a relationship between the magnetic flux and the resonant frequency.

15. A method of controlling a resonant frequency of frequency tunable devices which are connected to each other, wherein the controlling is performed using a ferromagnetic film arranged for magnetic interaction with the frequency tunable devices, the ferromagnetic film disposed adjacent to the frequency tunable devices and having an up magnetic domain or a down magnetic domain, and the method comprising:
   adjusting a position of a magnetic domain wall in the ferromagnetic film by applying a current to the magnetic film; and
   the adjusting of the position of the magnetic domain wall controlling a resonant frequency of the frequency tunable devices.

16. The method of claim 15, wherein the frequency tunable device comprise a tunable qubit and a tunable qubit coupler which are each made of a superconducting material.

17. The method of claim 15, further comprising generating the up magnetic domain or the down magnetic domain on the ferromagnetic film.

18. The method of claim 15, wherein the applying of the current comprises applying a pulse-type current greater than or equal to a predetermined threshold value.

19. The method of claim 15, wherein the current adjusts the position of the magnetic domain wall by inducing a spin-transfer torque (STT) phenomenon.

20. The method of claim 15, wherein the ferromagnetic film is disposed corresponding to an arrangement of the frequency tunable devices, and is placed at a predetermined distance from the frequency tunable devices.

* * * * *